(12) United States Patent
Zeng et al.

(10) Patent No.: US 12,507,499 B2
(45) Date of Patent: Dec. 23, 2025

(54) LAMINATED DOPANT SOURCE STRUCTURE, RELEVANT HIGH-QUALITY EMITTER AND PREPARATION METHOD THEREOF

(71) Applicant: NINGBO INSTITUTE OF MATERIALS TECHNOLOGY AND ENGINEERING, CHINESE ACADEMY OF SCIENCES, Ningbo (CN)

(72) Inventors: Yuheng Zeng, Ningbo (CN); Xian Zhang, Ningbo (CN); Jichun Ye, Ningbo (CN); Haojiang Du, Ningbo (CN); Zunke Liu, Ningbo (CN); Mingdun Liao, Ningbo (CN); Zhenhai Yang, Ningbo (CN); Wei Liu, Ningbo (CN)

(73) Assignee: NINGBO INSTITUTE OF MATERIALS TECHNOLOGY AND ENGINEERING, CHINESE ACADEMY OF SCIENCES, Ningbo (CN)

( * ) Notice: Subject to any disclaimer, the term of this patent is extended or adjusted under 35 U.S.C. 154(b) by 0 days.

(21) Appl. No.: 19/189,364

(22) Filed: Apr. 25, 2025

(65) Prior Publication Data

US 2025/0261472 A1 Aug. 14, 2025

Related U.S. Application Data

(63) Continuation of application No. PCT/CN2024/137738, filed on Dec. 9, 2024.

(30) Foreign Application Priority Data

Jan. 4, 2024 (CN) .......................... 202410011409.7

(51) Int. Cl.
*H10F 71/00* (2025.01)
*H10F 77/20* (2025.01)

(52) U.S. Cl.
CPC ......... *H10F 71/121* (2025.01); *H10F 71/128* (2025.01); *H10F 71/129* (2025.01); *H10F 77/211* (2025.01)

(58) Field of Classification Search
CPC .. H10F 71/1035; H10F 71/121; H10F 71/128; H10F 71/129; H10F 71/134; H10F 77/211; H10F 10/142
See application file for complete search history.

(56) References Cited

FOREIGN PATENT DOCUMENTS

| CN | 112103364 A | * 12/2020 | ........... H10F 71/121 |
| CN | 112310231 A | * 2/2021 | ........... H10F 71/121 |

(Continued)

OTHER PUBLICATIONS

Machine translation of CN-112103364-A, Zeng, Yu-heng. (Year: 2020).*

(Continued)

*Primary Examiner* — Mayla Gonzalez Ramos
(74) *Attorney, Agent, or Firm* — Bayramoglu Law Offices LLC (57) ABSTRACT

A laminated dopant source structure, a relevant high-quality emitter and a preparation method thereof are provided. The laminated dopant source structure includes a nano silicon oxide layer, a doped silicon oxide layer and a dopant source layer laminated on a front surface of a crystalline silicon substrate; the doped silicon oxide layer is doped with boron or phosphorus atoms; the material of the dopant source layer is selected from one of boron/phosphorus-doped amorphous silicon, carbon-doped boron/phosphorus-doped amorphous silicon, nitrogen-doped boron/phosphorus-doped amorphous silicon and carbon-nitrogen-doped boron/phospho- (Continued)

rus-doped amorphous silicon. The nano silicon oxide, the doped silicon oxide and the boron/phosphorus-doped amorphous silicon form the front surface dopant source. The dopant source structure combines strong laser absorption ability and high boron/phosphorus concentration, which helps reduce the laser power and irradiation time required for laser SE technology. Further, without loss of sheet resistance and junction depth, the surface recombination can be diminished.

20 Claims, 6 Drawing Sheets

(56) References Cited

FOREIGN PATENT DOCUMENTS

| | | | | |
|---|---|---|---|---|
| CN | 112490304 A | | 3/2021 | |
| CN | 116053330 A | * | 5/2023 | ........... H10F 71/121 |
| CN | 116130539 A | | 5/2023 | |
| CN | 116779717 A | * | 9/2023 | ......... H10F 71/1221 |
| CN | 116994945 A | | 11/2023 | |
| CN | 117913157 A | | 4/2024 | |
| DE | 102011103538 A1 | | 12/2012 | |

OTHER PUBLICATIONS

Machine translation of CN-112310231-A, Chen, Shu. (Year: 2021).*
Machine translation of CN-116779717-A, Zhang, Wen-chao. (Year: 2023).*
Machine translation of CN-116053330-A, Yu, Tian-bao. (Year: 2023).*

* cited by examiner

LAMINATED DOPANT SOURCE STRUCTURE, RELEVANT HIGH-QUALITY EMITTER AND PREPARATION METHOD THEREOF

CROSS REFERENCE TO THE RELATED APPLICATIONS

This application is a continuation application of International Application No. PCT/CN2024/137738, filed on Dec. 9, 2024, which is based upon and claims priority to Chinese Patent Application No. 202410011409.7, filed on Jan. 4, 2024, the entire contents of which are incorporated herein by reference.

TECHNICAL FIELD

The present disclosure relates to the technical field of photovoltaic cells and in particular to a laminated dopant source structure, a relevant high-quality emitter and a preparation method thereof.

BACKGROUND

Laser technology plays an important role in the crystalline silicon solar cells. In the cell manufacturing process, the main applications of the laser technology include laser doping, laser ablation and laser scribing etc. The laser-processed selective emitter (SE) technology can further lower the production costs of the cells and increase the conversion efficiency in the industry and thus has gained wide recognition. The laser SE technology refers to performing selective doping based on the selective heating characteristics of the laser to form a heavily-doped area in a contact part of an electrode gridline and a silicon wafer, which can improve a doping concentration of the electrode contact area and reduce a contact resistance. By optimization on laser parameters, higher photo-electric conversion efficiency can be realized.

At present, based on the technology of the Tunnel Oxide Passivated Contact (TOPCon) cells, the laser doping is mainly applied to the boron-diffused SE. The common boron diffusion technology in the current industry mainly includes thermal diffusion, that is, borosilicate glass (BSG) is formed by boron tribromide ($BBr_3$) and boron trichloride ($BCl_3$) in a diffusion furnace at high temperature. The boiling point of the byproduct $B_2O_3$ of the boron tribromide diffusion is very high and always remains in liquid state during the diffusion process. Further, the byproduct has a higher viscosity at a lower temperature, which has strong corrosion effect on quartz devices. The door of the quartz furnace can be easily stuck and even damaged when opened or closed. Although boron trichloride can prevent the furnace door from being stuck, strongly-corrosive byproducts such as HCl or $Cl_2$ or the like can be produced, which poses severe influence on the lifespan of the equipment or pipes. Furthermore, in the BSG boron source formed in the thermal diffusion, the boron concentration is pretty low and the solid solubility of boron in silicon is also very low. Therefore, when the boron atoms therein are doped into the silicon substrate by laser processing, a higher-power laser is required. But excessively high laser power can easily bring textured surface damage in the laser-irradiated area and hence affect subsequent passivation process. So, it is difficult to carry out the selective doping process using laser, with BSG as boron source.

In order to address the above issue, the patent documents CN116130539A and CN116994945A disclose a process of depositing a source layer using a chemical vapor deposition (CVD) technology, which, to some extent, solves the laser selective doping problem. However, the above technology still causes a boron defect in the processing procedure, leading to increased recombination. Meanwhile, the surface boron concentration is difficult to lower. These factors can affect the passivation effect of the non-laser area. In this case, it is still greatly difficult to realize further improvement in the solar cell efficiency.

SUMMARY

For the defects of the prior arts, the present disclosure aims to improve the absorption ability of a dopant source for laser while reducing a diffusion element concentration on an emitter surface, so as to improve the emitter passivation effect.

In order to address the above problems, a first aspect of the present disclosure provides a laminated dopant source structure, which includes a nano silicon oxide layer, a doped silicon oxide layer and a dopant source layer laminated on a front surface of a crystalline silicon substrate. The doped silicon oxide layer is doped with boron or phosphorus atoms. The material of the dopant source layer is selected from one of boron/phosphorus-doped amorphous silicon, carbon-doped boron/phosphorus-doped amorphous silicon, nitrogen-doped boron/phosphorus-doped amorphous silicon and carbon-nitrogen-doped boron/phosphorus-doped amorphous silicon.

In the present disclosure, the nano silicon oxide, the doped silicon oxide and the boron/phosphorus-doped amorphous silicon form the front surface dopant source. The dopant source structure combines strong laser absorption ability and high boron/phosphorus concentration, which helps reduce the laser power and irradiation time required for laser SE technology. Further, without loss of sheet resistance and junction depth, the surface recombination can be diminished, improving the passivation effect and promoting the cell efficiency.

Furthermore, the thickness of the nano silicon oxide layer is 1 to 3 nm, the thickness of the doped silicon oxide layer is 1 to 100 nm, and the thickness of the dopant source layer is 10 to 500 nm. An ultrathin nano silicon oxide layer is laid to adjust a boron/phosphorus activation concentration in the non-laser area to improve the passivation effect. The existence of the doped silicon oxide can lower the boron/phosphorus activation concentration in the non-laser area and optimize boron diffusion, so as to improve the passivation effect. The boron/phosphorus-doped amorphous silicon has strong laser absorption ability and can perform effective doping under low power laser.

Furthermore, the boron doping concentration in the dopant source layer is 5E17 to 5E19 $cm^{-3}$, and the phosphorus doping concentration is 5E17 to 1E20 $cm^{-3}$. The dopant source layer has pretty high boron/phosphorus atom concentration and can perform effective doping under low power laser. The dopant source layer can be doped with atoms such as C and N to further improve the passivation effect.

Furthermore, the laminated dopant source structure further includes a silicide layer laid on the dopant source layer. The material of the silicide layer is selected from one of silicon nitride, silicon carbide, silicon carbonitride and silicon oxide. The thickness of the silicide layer is 10 to 300 nm. The disposal of the silicide layer can further reduce defects and achieve a degree of hydrogenation effect.

A second aspect of the present disclosure provides a method of preparing a high-quality emitter using the above laminated dopant source structure, which includes the following steps:

at step S1, preparing a nano silicon oxide layer on a front surface of a crystalline silicon substrate;

at step S2, performing plasma treatment on the nano silicon oxide layer;

at step S3, depositing a doped silicon oxide layer on a surface of the nano silicon oxide layer;

at step S4, depositing a dopant source layer on a surface of the doped silicon oxide layer;

at step S5, performing laser processing on an electrode area to enable boron or phosphorus to diffuse to the crystalline silicon substrate;

at step S6, performing high-temperature annealing to enable the laser-processed area to be subjected to boron or phosphorus secondary diffusion and the non-laser area to be subjected to boron or phosphorus diffusion;

at step S7, removing remaining laminated dopant source structure so that a front surface of the crystalline silicon substrate is formed into a selective emitter structure.

Furthermore, before the step S5, the method further includes depositing a silicide layer on a surface of the dopant source layer.

Furthermore, by chemical vapor deposition technology, the doped silicon oxide layer, the dopant source layer and the silicide layer are prepared. Depositing the source layer based on CVD technology eliminates the use of the conventional $BBr_3$ thermal diffusion furnace, saves the production costs and guarantees uniform deposition. Thus, the sheet resistance of the emitter has high uniformity.

Furthermore, in the step S1, the preparation method of the nano silicon oxide layer is selected from one of wet chemical method, high-temperature oxidation method, ozone oxidation method and plasma assisted oxidation method. The silicon oxide prepared by the above method has good growth quality as well as strong blocking ability for the dopant, achieving excellent interfacial chemical passivation level.

Furthermore, in the step S2, the plasma is selected from one or more of $H_2$, Ar, $N_2O$, $C_2O$, $NH_3$. Plasma treatment is performed on the nano silicon oxide layer to remove a part of interfacial point defects so as to further promote the passivation quality.

Furthermore, in the step S5, surface treatment is performed on the source layer by laser. The laminated dopant source structure in the present disclosure has a far larger light absorption ability than BSG and can perform more effective diffusion under the same laser power and irradiation time. Therefore, under lower power and shorter irradiation time, the same doping effect as the conventional BSG source layer can be realized, helping reduce the damage of the laser on the textured surface and lower the laser process costs.

Furthermore, in the step S6, the treatment temperature for the high-temperature annealing is 800 to 1200° C. so that the doped atoms can be diffused into the substrate by high temperature.

Furthermore, the step S7 specifically includes: etching away the dopant source layer by an inorganic alkaline solution, and etching away the doped silicon oxide layer and the nano silicon oxide layer by using hydrofluoric acid, and then etching the surface of the crystalline silicon substrate by an organic alkaline solution or alternately etching the surface of the crystalline silicon substrate by hydrofluoric acid and nitric acid. The laminated structure may combine with different etching solutions to increase a selective etching ratio and control an etching depth and accurately remove the source layer.

A third aspect of the present disclosure provides a high-quality emitter, which is prepared by the above preparation method. The selective emitter prepared by the process of the present disclosure can effectively reduce a contact resistance of the emitter and a metal electrode while decreasing the recombination of the area outside the electrode. The emitter formed by the non-laser area after the annealing has excellent passivation performance.

Furthermore, the high-quality emitter contains carbon and/or nitrogen element. The carbon and nitrogen atoms can inhibit boron activation and lower the surface boron concentration so as to decrease the surface recombination and improve the passivation effect.

Numerals of the drawings are described below:
1. crystalline silicon substrate, 2. nano silicon oxide layer, 3. doped silicon oxide layer, 4. dopant source layer, 5. silicide layer, 6. laser-processed area, and 7. non-laser processed area.

DETAILED DESCRIPTION OF THE EMBODIMENTS

In order to make the above objects, features and advantages of the present disclosure clearer and more intelligible, the specific examples of the present disclosure will be detailed below in combination with drawings. It should be noted that the examples below are used only to illustrate the implementation method and typical parameters of the present disclosure rather than to limit the parameter range of the present disclosure. Any reasonable change derived therefrom will still fall within the scope of protection of the claims of the present disclosure.

It should be noted that the endpoints and any values of the ranges disclosed herein are not limited to such accurate ranges or values. These ranges or values should be understood as including values close to these ranges or values. For the numerical ranges, mutual combination can be performed between the endpoint values of each range, between an endpoint value of each range and an individual point value and between individual point values to form one or more new numerical ranges. These numerical ranges shall be considered as specifically disclosed herein.

Figure 1:
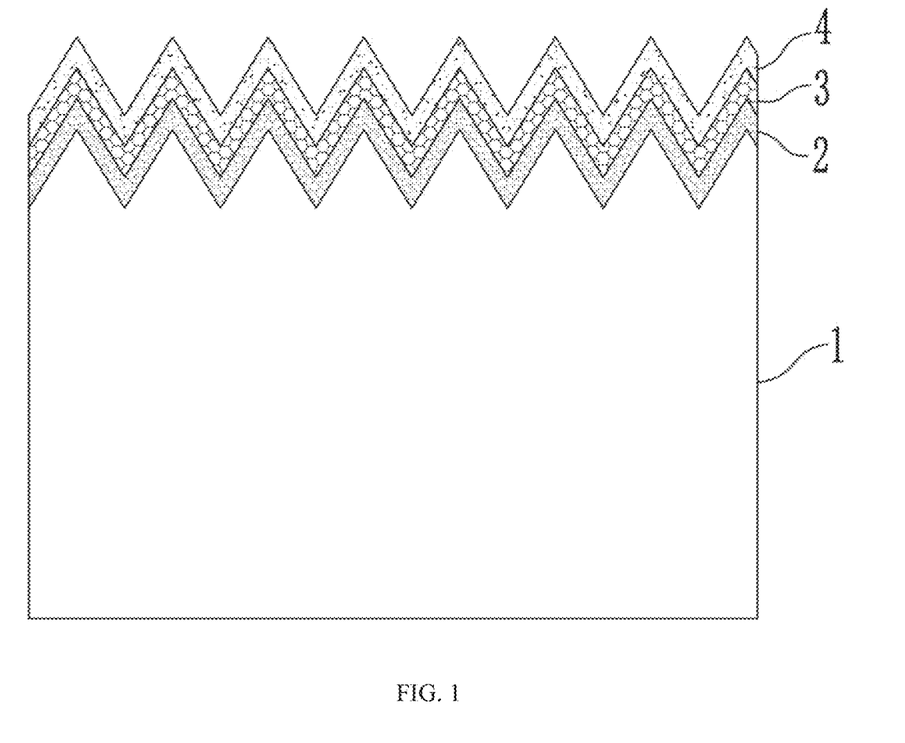
FIG. 1 is a structural schematic diagram illustrating a laminated dopant source structure according to a specific example of the present disclosure.

A specific example of the present disclosure provides a laminated dopant source structure, with its typical structure as shown in FIG. 1. The laminated dopant source structure includes a nano silicon oxide layer 2, a doped silicon oxide layer 3 and a dopant source layer 4 sequentially laminated on a front surface of a crystalline silicon substrate. The laminated dopant source structure is applicable to silicon wafers with different surface morphologies including textured surface, alkali-polished surface and acid-polished surface and the like.

In a specific example, the thickness of the nano silicon oxide layer 2 is 1 to 3 nm. The ultrathin nano silicon oxide layer 2 can adjust the boron/phosphorus activation concentration of the non-laser area, so as to improve the passivation effect.

In a specific example, the thickness of the doped silicon oxide layer 3 is 1 to 100 nm, and the doped silicon oxide layer 3 is doped with boron or phosphorus atoms. The doped silicon oxide layer 3 has the effect of blocking excessive etching and lowering the boron/phosphorus diffusion concentration. The doped silicon oxide contains oxygen element to optimize boron/phosphorus diffusion. Without the loss of the junction depth and sheet resistance of the boron/phosphorus diffusion, the surface recombination is decreased, which improves the passivation effect. Further, along with increase of oxygen content, the surface boron concentration drops quickly and the sheet resistance increases accordingly.

In a specific example, the dopant source layer 4 is boron/phosphorus-doped amorphous silicon with a thickness of 10 to 500 nm, where the boron doping concentration is 5E17 to 5E19 $cm^{-3}$ and the phosphorus doping concentration is 5E17 to 1E20 $cm^{-3}$. The dopant source layer 4 contains high boron/phosphorus concentration and has strong laser absorption ability. Preferably, the dopant source layer 4 is further doped with carbon and/or nitrogen element, with a content of 5 at % to 25 at %. The doping of C and N atoms can improve the passivation effect.

The above dopant source structure combines strong laser absorption ability and high boron/phosphorus concentration, which helps reduce the laser power and irradiation time required for laser SE technology. Further, the multi-layer dopant source structure helps lower the surface boron/phosphorus concentration, reduce defects, improve the passivation effect of the emitter and promote the cell efficiency.

Figure 2:
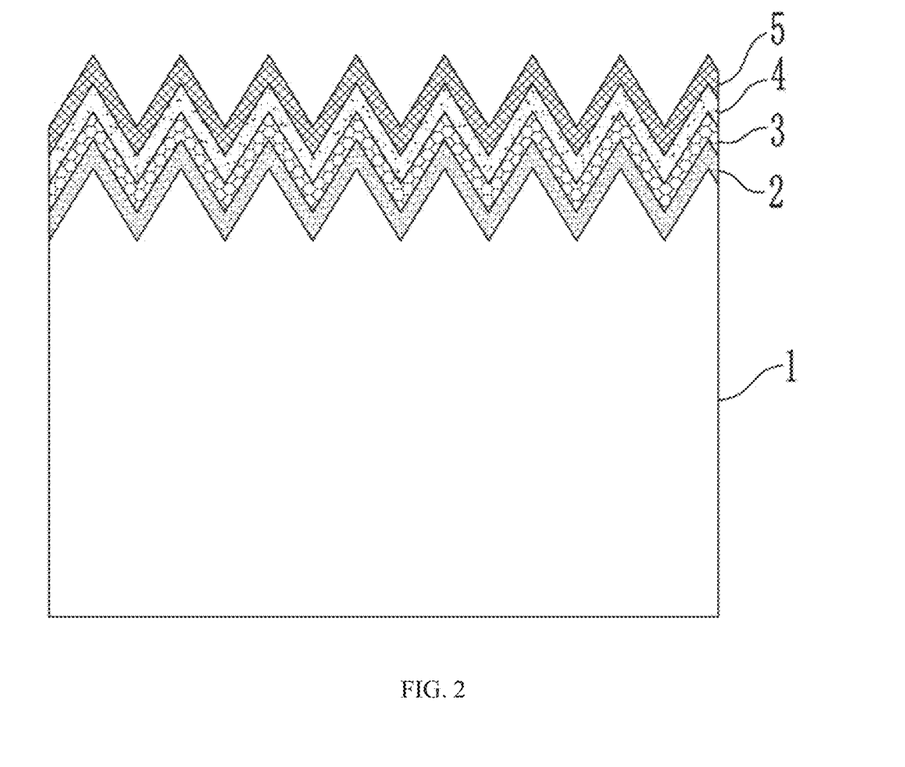
FIG. 2 is a structural schematic diagram illustrating a laminated dopant source structure according to another specific example of the present disclosure.

A specific example of the present disclosure provides another laminated dopant source structure, on which an outer layer a silicide layer 5 is added on the basis of the above example, with a typical structure shown in FIG. 2. The laminated dopant source structure includes the nano silicon oxide layer 2, the doped silicon oxide layer 3, the dopant source layer 4 and the silicide layer 5 sequentially laminated on the front surface of the crystalline silicon substrate 1.

In a specific example, the material of the silicide layer 5 is selected from one of silicon nitride, silicon carbide, silicon carbonitride and silicon oxide. The thickness of the silicide layer 5 is 10 to 300 nm. The addition of the silicide layer 5 can further reduce defects and also achieve a degree of hydrogenation effect.

Figure 3:
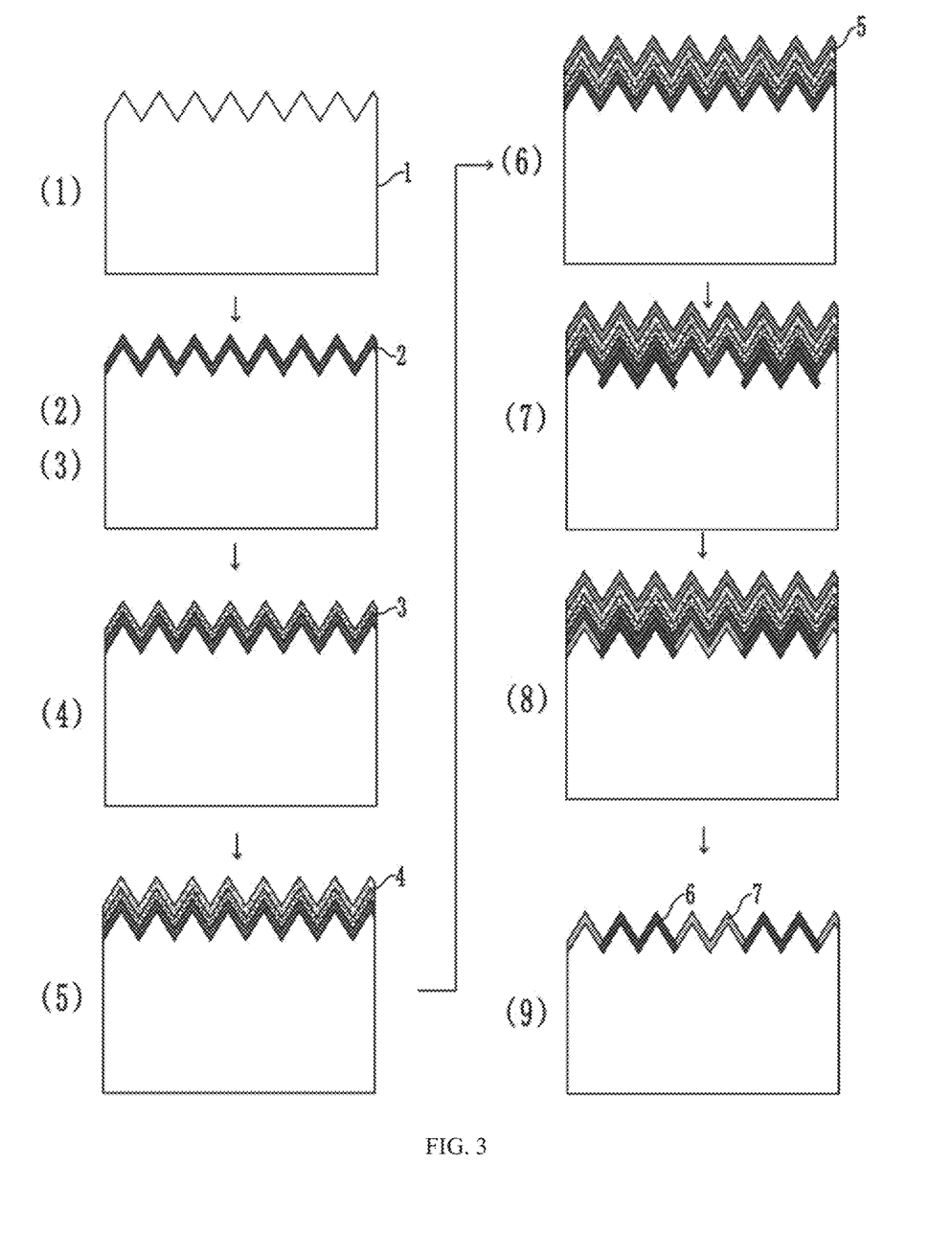
FIG. 3 is a flowchart illustrating a preparation method of a selective emitter according to a specific example of the present disclosure.

A specific example of the present disclosure further provides a method of preparing a selective emitter using the above laminated dopant source structure. With an n-type crystalline silicon substrate as example, the typical process flow is shown in FIG. 3. The flow includes the following steps.

(1) An n-type silicon wafer is prepared and the front surface is cleaned and textured as a crystalline silicon substrate 1.

(2) One nano silicon oxide layer 2 is prepared on the front surface of the crystalline silicon substrate 1. The nano silicon oxide layer 2 is prepared using wet chemical method, high-temperature oxidation method, ozone oxidation method or plasma-assisted oxidation method or the like.

(3) Plasma treatment is performed on the nano silicon oxide layer 2. The plasma is selected from one or more of $H_2$, Ar, $N_2O$, $C_2O$, $NH_3$. The plasma treatment method is preferable a Plasma Enhanced Chemical Vapor Deposition (PECVD) method. The step can remove a part of interfacial point defects to further improve the passivation quality.

(4) A doped silicon oxide layer 3 is deposited on a surface of the plasma-treated nano silicon oxide layer 2. The doped silicon oxide layer 3 is prepared by chemical vapor deposition technology such as APCVD, LPCVD, PECVD and HWCVD etc.

(5) The dopant source layer 4 is deposited on the surface of the doped silicon oxide layer 3. The dopant source layer 4 is prepared by chemical vapor deposition technology such as APCVD, LPCVD, PECVD and HWCVD etc.

(6) The silicide layer 5 is deposited on the surface of the dopant source layer 4. The silicide layer 5 is prepared by chemical vapor deposition technology such as APCVD, LPCVD, PECVD and HWCVD etc. After the step is completed, the laminated dopant source structure formed by the nano silicon oxide layer 2, the doped silicon oxide layer 3, the dopant source layer 4 and the silicide layer 5 can be obtained.

(7) Laser processing is performed on the designed electrode area so that the boron/phosphorus of the dopant source structure can diffuse to the crystalline silicon substrate 1. A nanosecond pulse laser with a wavelength of 532 nm or 325 nm is used, where the laser power is 20 to 500 W and the scanning rate is 10 to 120 m/s. In this step, under lower power and shorter irradiation time, the same doping effect as the conventional BSG source layer can be realized, helping reduce the damage of the laser on the textured surface and lower the laser process costs.

(8) High-temperature annealing treatment is performed to enable the laser-processed area 6 to be subjected to boron/phosphorus secondary diffusion and the non-laser processed area 7 to be subjected to boron/phosphorus diffusion. The typical treatment temperature of the high-temperature annealing is 800 to 1200° C., and preferably, 950 to 1050° C., with a time of 10 to 300 min. The annealing atmosphere is nitrogen and oxygen gases.

(9) The remaining dopant source structure is removed. The wet etching process is employed, and the etching solution is selected from HF, HNO3, inorganic alkaline solution and organic alkaline solution and the like. The specific step is as follows: etching away the dopant source layer 4 by an inorganic alkaline solution, and etching away the doped silicon oxide layer 3 and the nano silicon oxide layer 2 by using hydrofluoric acid, and then etching the surface of the crystalline silicon substrate 1 by an organic alkaline solution. The micro-etching of the surface of the crystalline silicon substrate 1 may also be completed by alternately etching using hydrofluoric acid and nitric acid.

After the above step is completed, the laser-processed area 6 and the non-laser processed area 7 both having different doping concentrations are formed on the front surface of the crystalline silicon substrate 1, with the structure shown in FIG. 3. Thus, the selective emitter structure can be obtained. In a specific example, the sheet resistance of the laser-processed area 6 of the selective emitter structure prepared by the above method can be adjustable in the range of ten to several hundred Ω/sq. The sheet resistance of the non-laser processed area 7 can be adjustable in the range of several dozen to several thousand Ω/sq. SIMS test is performed on the prepared emitter, finding elements such as boron, oxygen and carbon doped in the emitter and their diffusion in the silicon substrate.

The above method is also applicable to preparation of a laser-phosphorus-doped emitter on a p-type silicon wafer.

The technical schemes and technical effects of the present disclosure will be further described by way of specific examples.

Example 1

An n-type quartz substrate was cleaned and then plasma treatment of $N_2O/H_2$ was performed on the silicon oxide dielectric layer by PECVD. Next, a 10 nm doped silicon oxide film (oxygen content is 15 at %) and 50 nm carbon-doped boron-doped amorphous silicon film (carbon content is 5 at %) were deposited.

Control Example 1

An n-type quartz substrate was cleaned and a 50 nm boron silicon glass (BSG) film was deposited on the surface of the silicon wafer in a $BBr_3$ diffusion furnace.

Figure 4:
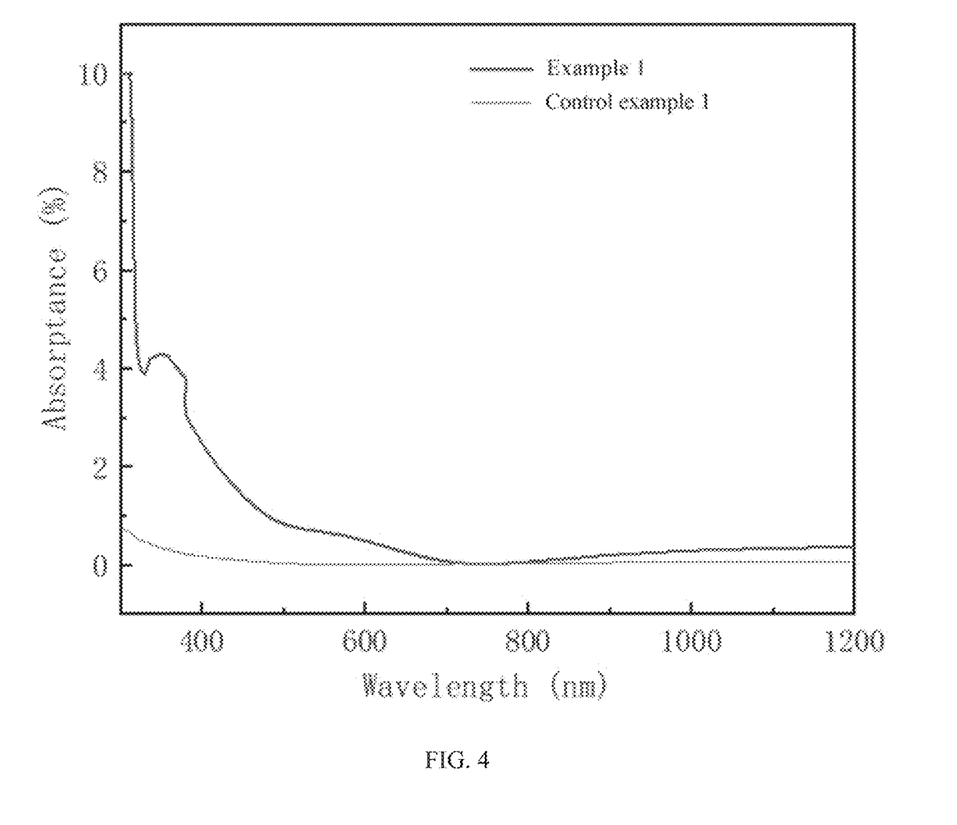
FIG. 4 is a comparison diagram of absorption spectra of an example 1 and a control example 1 of the present disclosure.

The absorption spectra of the samples prepared in the example 1 and the control example 1 are tested with the result shown in FIG. 4. It can be seen from the absorption spectra of FIG. 4 that the light absorption ability of the carbon-doped boron-doped amorphous silicon deposited by PECVD is far larger than that of the BSG, thereby having better laser doping effect.

Example 2

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 5 at %) were deposited. By using a nanosecond pulse laser of a wavelength of 325 nm (the laser power 50 W and the scanning rate 30 m/s), boron advancing treatment was performed. Cleaning was carried out and the source layer was etched away.

Example 3

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 5 at %) were deposited. By using a nanosecond pulse laser of a wavelength of 325 nm (the laser power 25 W and the scanning rate 15 m/s), boron advancing treatment was performed. Cleaning was carried out and the source layer was etched away.

Control Example 2

An n-type crystalline silicon substrate was prepared, cleaned and textured. The crystalline silicon substrate was placed in a $BBr_3$ diffusion furnace and a 50 nm boron silicon glass (BSG) film was deposited. By using a nanosecond pulse laser of a wavelength of 325 nm (the laser power 50 W and the scanning rate 30 m/s), boron advancing treatment was performed. Cleaning was carried out and the source layer was etched away.

Control Example 3

An n-type crystalline silicon substrate was prepared, cleaned and textured. The crystalline silicon substrate was placed in a $BBr_3$ diffusion furnace and a 50 nm boron silicon glass (BSG) film was deposited. By using a nanosecond pulse laser of a wavelength of 325 nm (the laser power 25 W and the scanning rate 15 m/s), boron advancing treatment was performed. Cleaning was carried out and the source layer was etched away.

The sheet resistances and junction depths of the laser-processed areas of the samples prepared in the examples 2 to 3 and the control examples 2 to 3 are tested with the results shown in Table 1 below.

TABLE 1

| the sheet resistances and junction depths of the laser-processed areas of the samples | | |
|---|---|---|
| Parameter | Sheet resistance | Junction depth |
| Example 2 | 55 Ω/Sq. | 0.71 μm |
| Example 3 | 95 Ω/Sq. | 0.45 μm |
| Control example 2 | 277 Ω/Sq. | 0.21 μm |
| Control example 3 | 785 Ω/Sq. | 0.05 m |

It can be known from the test results of Table 1 that under the same laser condition, the nano silicon oxide/boron-doped silicon oxide/carbon-doped boron-doped amorphous silicon boron source can perform more effective doping; under low laser power, it is difficult for the BSG boron source to carry out doping and the nano silicon oxide/boron-doped silicon oxide/carbon-doped boron-doped amorphous silicon boron source can still achieve better doping effect.

Example 4

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm boron-doped amorphous silicon film were deposited on the surface of the silicon oxide dielectric layer. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride.

Example 5

Figure 5:
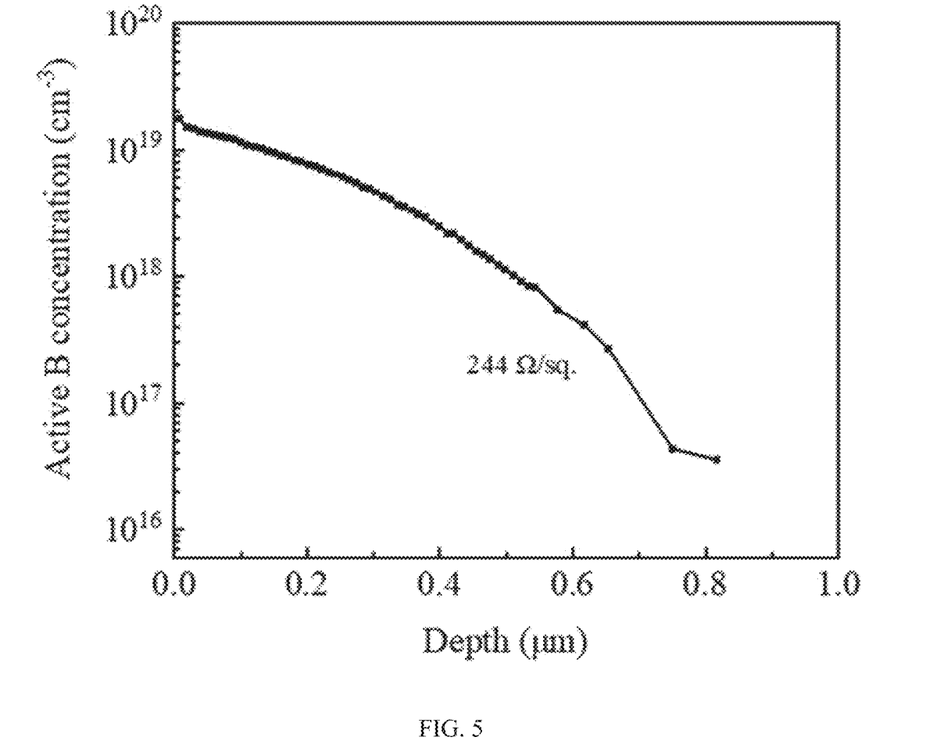
FIG. 5 is a curve diagram illustrating boron diffusion of a selective emitter according to an example 5 of the present disclosure.

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 5 at %) and a 50 nm carbon-doped boron-doped amorphous silicon film (carbon content 5 at %) were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride. The curve of the boron diffusion of the selective emitter prepared in the example is as shown in FIG. 5, where the sheet resistance is 244Ω/Sq.

Example 6

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 5 at %) were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride.

Example 7

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 25 at %) and a 50 nm carbon-doped boron-doped amorphous silicon film (carbon content 5 at %) were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride.

Example 8

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 15 at %) were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride.

Example 9

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 25 at %) were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface of the silicon substrate by ALD aluminum oxide and plate-type PECVD silicon nitride.

Example 10

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %), a 50 nm carbon-doped boron-doped amorphous silicon film (carbon content 15 at %) and a 70 nm silicon nitride film were deposited. Annealing treatment was performed at a high temperature of 1000° C. for 240 min to form a pn junction. Next, selective etching was performed on the boron source layer by using KOH solution, HF and TMAH. After the etching was completed, SIMS test was performed on the samples, finding the boron, oxygen and carbon elements were doped in the silicon substrate. Passivation treatment was performed on the surface by ALD aluminum oxide and plate-type PECVD silicon nitride.

Control Example 4

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. Next, a 50 nm boron-doped amorphous silicon film was deposited on the surface of the silicon oxide dielectric layer. Annealing treatment was performed at a high temperature of 1000° C. for 240 min to form a pn junction. Next, selective etching was performed on the boron source layer by using KOH solution. After the etching was completed, passivation treatment was performed on the surface by ALD aluminum oxide and plate-type PECVD silicon nitride.

Control Example 5

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 50 nm boron-doped amorphous silicon film was deposited on the surface of the silicon oxide dielectric layer. Annealing treatment was performed at a high temperature of 1000° C. for 240 min to form a pn junction. Next, selective etching was performed on the boron source layer by using KOH solution. After the etching was completed, passivation treatment was performed on the surface by ALD aluminum oxide and plate-type PECVD silicon nitride.

The emitter sheet resistance, junction depth and current density ($J_{0,s}$) of the emitter passivation sheets prepared in the examples 4 to 10 and the control examples 4 to 5 are tested with the results shown in Table 2 below.

TABLE 2 the emitter key parameters of the non-laser processed areas of the passivation sheets

| Parameter | Sheet resistance | Junction depth | $J_{0,s}$ | iVoc |
|---|---|---|---|---|
| Example 4 | 235 Ω/Sq. | 0.8 μm | 9.0 fA/cm$^2$ | 712 mV |
| Example 5 | 244 Ω/Sq. | 0.77 μm | 8.2 fA/cm$^2$ | 718 mV |
| Example 6 | 360 Ω/Sq. | 0.63 μm | 6.7 fA/cm$^2$ | 719 mV |
| Example 7 | 680 Ω/Sq. | 0.45 μm | 4.3 fA/cm$^2$ | 728 mV |
| Example 8 | 344 Ω/Sq. | 0.70 μm | 6.2 fA/cm$^2$ | 722 mV |
| Example 9 | 523 Ω/Sq. | 0.51 μm | 4.0 fA/cm$^2$ | 730 mV |
| Example 10 | 280 Ω/Sq. | 0.74 μm | 5 fA/cm$^2$ | 725 mV |
| Control example 4 | 96 Ω/Sq. | 0.9 μm | 61 fA/cm$^2$ | 686 mV |
| Control example 5 | 102 Ω/Sq. | 0.88 μm | 45 fA/cm$^2$ | 690 mV |

It can be known from the test results of Table 2 that performing plasma treatment on the nano silicon oxide layer and adding one boron-doped silicon oxide layer between the silicon oxide and the boron-doped amorphous silicon can both effectively inhibit boron diffusion and defects of the silicon substrate surface of the non-laser area and obviously enhance the boron emitter passivation effect of the non-laser area. The introduction of carbon atoms into the boron-doped amorphous silicon helps further inhibit boron diffusion and improve the passivation effect. The addition of the silicon nitride cover layer on the outermost layer can further reduce defects and improve the passivation effect.

Example 11

An n-type crystalline silicon substrate was prepared, cleaned and textured. The crystalline silicon substrate was placed in 110° C. $HNO_3$ solution and held for 15 min to enable its surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 25 at %) were deposited. By using a nanosecond pulse laser of a wavelength of 325 nm (the laser power 25 W and the scanning rate 15 m/s), boron advancing treatment was performed. Then, annealing treatment was performed at a high temperature of 1000° C. for 240 min to form a heavily-doped structure. Selective etching was performed on the boron source layer by alternately using KOH solution and HF.

Control Example 6

An n-type crystalline silicon substrate was prepared and textured on the front surface and polished on the back surface and then subjected to standard RCA cleaning. The crystalline silicon substrate was placed in a $BBr_3$ diffusion furnace and a BSG layer of about 50 nm was deposited on the front surface. By using a nanosecond pulse laser of a wavelength of 325 nm (the laser power 25 W and the scanning rate 15 m/s), boron advancing treatment was performed. Next, annealing treatment was performed at a high temperature of 1000° C. for 240 min to form a heavily-doped structure. Then, selective etching was performed on the boron source layer by alternately using HF.

Figure 6:
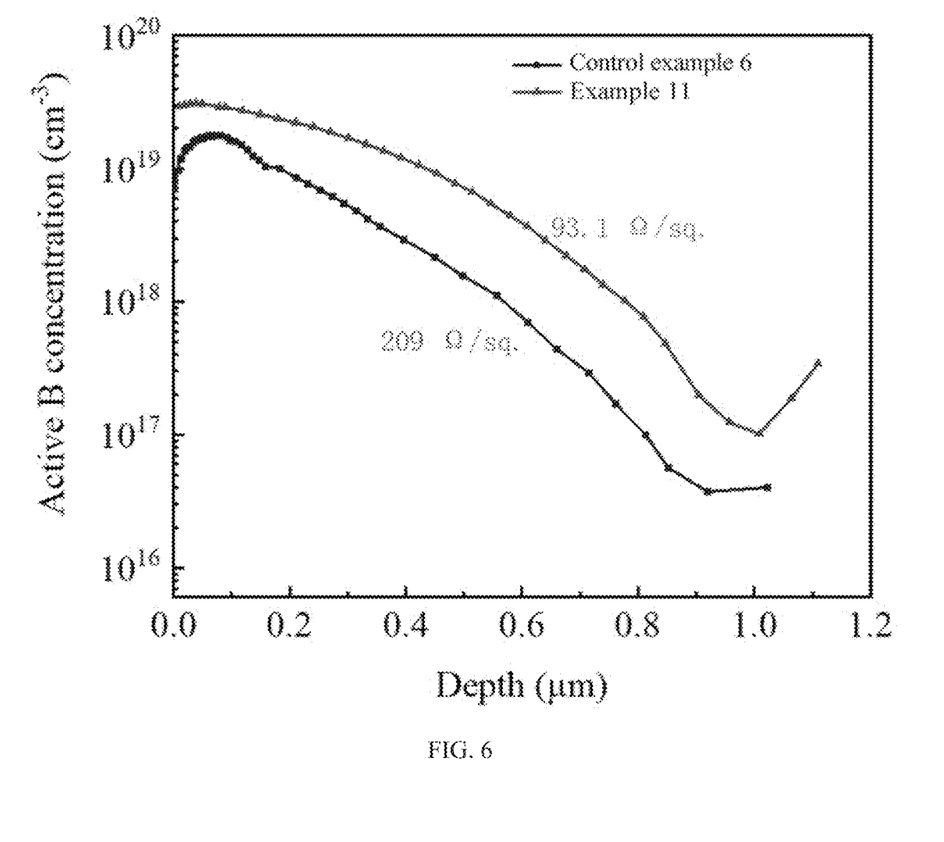
FIG. 6 is a curve diagram illustrating boron diffusion of a selective emitter according to an example 11 and a control example 6 of the present disclosure.

The boron diffusion curve and sheet resistance of the emitter prepared in the example 11 and the control example 6 are tested with Electrochemical Capacitance Voltage (ECV) and four-point probe, with the results shown in FIG. 6. It can be known from the test results that, compared with the boron silicon glass, the laminated dopant source structure in the present disclosure can obtain higher boron concentration and larger junction depth under the same laser and annealing conditions, realizing more effective doping.

Example 12

An n-type crystalline silicon substrate was prepared and textured on the front surface and polished on the back surface and then subjected to standard RCA cleaning. The crystalline silicon substrate was placed in 110° C. $HNO_3$ solution and held for 15 min to enable its front surface to grow about 1.5 nm of silicon oxide dielectric layer. By PECVD, plasma treatment of $N_2O/H_2$ was performed on the silicon oxide dielectric layer. Next, a 10 nm boron-doped silicon oxide film (oxygen content 15 at %) and a 50 nm carbon-doped boron-doped amorphous silicon film (carbon content 15 at %) were deposited. By using a nanosecond pulse laser of a wavelength of 325 nm (the laser power 25 W and the scanning rate 15 m/s), boron advancing treatment was performed on the designed electrode area. Then, annealing treatment was performed entirely at a high temperature of 1000° C. for 240 min to form a selective emitter structure. Then, selective etching was performed on the boron source layer by using KOH solution, HF and TMAH. After the etching was completed, passivation treatment was performed on the surface by using aluminum oxide and silicon nitride. A metal electrode was printed on the electrode area by screen printing method and belt furnace sintering was carried out.

Control Example 7

An n-type crystalline silicon substrate was prepared and textured on the front surface and polished on the back surface and then subjected to standard RCA cleaning. A boron emitter was formed on the silicon wafer by $BBr_3$ thermal diffusion method. After the boron source layer was etched away, passivation treatment was performed on the surface by aluminum oxide and silicon nitride. A metal electrode was printed on the electrode area by screen printing method and belt furnace sintering was carried out.

The selective emitter prepared in the example 12 and the conventional boron emitter prepared in the control example 7 are tested in performance. The test contents include total current density ($J_{0,total}$), current density and contact resistivity ($\rho_{c,met}$) of the electrode contact area, diffusion area sheet resistance ($R_{sq}$) and current density ($J_{0,pass}$) of the non-electrode contact area, with the results shown in Table 3 below.

TABLE 3

Performance comparison of the selective emitter and conventional boron emitter

| Parameter | $J_{0, total}$ (fA/cm$^2$) | $J_{0, met}$ (fA/cm$^2$) | $\rho_{c, met}$ (mΩ·cm$^2$) | $R_{sq}$ (Ω/sq.) | $J_{0, pass}$ (fA/cm$^2$) |
|---|---|---|---|---|---|
| Example 12 | 21 | 180-250 | 0.33 | 344 | 6.2 |
| Control example 7 | 163 | 200-400 | 1.3 | 188 | 24 |

It can be known from the test results in Table 3 that the entire passivation performance of the selective emitter structure prepared in the example 12, the passivation performance of the electrode contact area and the passivation performance of the non-electrode contact area are all noticeably superior to those of the boron emitter prepared by conventional method.

Example 13

An n-type crystalline silicon substrate was prepared and textured on the front surface and polished on the back surface and then subjected to standard RCA cleaning. The crystalline silicon substrate was placed in 110° C. $HNO_3$ solution and held for 15 min to enable its front surface to grow about 1.5 nm of silicon oxide dielectric layer. By PECVD, plasma treatment of $N_2O/H_2$ was performed on the silicon oxide dielectric layer. Next, a 5 nm boron-doped silicon oxide film (oxygen content 15 at %) and a 50 nm carbon-doped boron-doped amorphous silicon film (carbon content 15 at %) were deposited. By using a nanosecond pulse laser of a wavelength of 325 nm (the laser power 25 W and the scanning rate 15 m/s), boron advancing treatment was performed on the designed electrode area. Then, annealing treatment was performed entirely at a high temperature of 1000° C. for 240 min to form a selective emitter structure. Then, selective etching was performed on the boron source layer by using KOH solution, HF and TMAH. The back surface of the silicon wafer was treated for 15 min by 110° C. nitric acid to enable the back surface of the silicon wafer to grow about 1.5 nm of silicon oxide. By the tubular PECVD, a 80 nm phosphorus-doped amorphous silicon layer was deposited on the back surface of the silicon wafer and annealed for 30 min at a temperature of 840° C. to form a TOPCon structure. By using aluminum oxide and silicon nitride, passivation treatment was performed on the front surface. A double-face electrode was printed by screen printing and belt furnace sintering was carried out.

Control Example 8

An n-type crystalline silicon substrate was prepared and textured on the front surface and polished on the back surface and then subjected to standard RCA cleaning. A boron emitter was formed on the silicon wafer by $BBr_3$ thermal diffusion method on the front surface of the crystalline silicon substrate. After RCA cleaning was completed, treatment was performed by 110° C. nitric acid for 15 min to grow about 1.5 nm of silicon oxide on the back surface of the silicon wafer. By the tubular PECVD, a 60 nm phosphorus-doped amorphous silicon layer was deposited on the back surface of the silicon wafer and annealed for 30 min at a temperature of 840° C. to form a TOPCon structure. By using aluminum oxide and silicon nitride, passivation treatment was performed on the front surface. A double-face electrode was printed on both sides by screen printing and belt furnace sintering was carried out.

The key parameters of the TOPCon cells prepared in the example 13 and the control example 8 are tested, which include open circuit voltage ($V_{oc}$), short circuit current ($J_{sc}$), a filling factor (FF) and conversion efficiency (PCE), with the results shown in Table 4 below.

TABLE 4 comparison of key parameters of the TOPCon cells in the example 13 and the control example 8

| Parameter | $V_{oc}$ | $J_{sc}$ | FF | PCE |
|---|---|---|---|---|
| Example 13 | 731.1 mV | 41.93 mA/cm$^2$ | 85.46% | 26.20% |
| Control example 8 | 729.2 mV | 41.88 mA/cm$^2$ | 85.18% | 25.99% |

It is proved by the test results of Table 4 that the selective emitter prepared by the method in the present disclosure can obviously improve the open circuit voltage and the filling factor of the cells, and the TOPCon cells prepared increase its efficiency by about 0.3% over the cells without the selective emitter.

Although the present disclosure is made as above, the present disclosure is not limited hereto. Any persons skilled in the arts can make various changes and modifications within the spirit and scope of the present disclosure. Therefore, the scope of protection of the present disclosure shall be indicated in the claims.

What is claimed is:

1. A laminated dopant source structure, comprising a nano silicon oxide layer, a doped silicon oxide layer, and a dopant source layer, wherein the nano silicon oxide layer, the doped silicon oxide layer, and the dopant source layer are laminated on a front surface of a crystalline silicon substrate; the doped silicon oxide layer is doped with boron or phosphorus atoms; a material of the dopant source layer is selected from one of boron/phosphorus-doped amorphous silicon, carbon-doped boron/phosphorus-doped amorphous silicon, nitrogen-doped boron/phosphorus-doped amorphous silicon, and carbon-nitrogen-doped boron/phosphorus-doped amorphous silicon.

2. The laminated dopant source structure of claim 1, wherein a thickness of the nano silicon oxide layer is 1 to 3 nm, a thickness of the doped silicon oxide layer is 1 to 100 nm, and a thickness of the dopant source layer is 10 to 500 nm.

3. The laminated dopant source structure of claim 1, wherein a boron doping concentration in the dopant source layer is 5E17 to 5E19 cm$^{-3}$, and a phosphorus doping concentration is 5E17 to 1E20 cm$^{-3}$.

4. The laminated dopant source structure of claim 1, further comprising a silicide layer laid on the dopant source layer; a material of the silicide layer is selected from one of silicon nitride, silicon carbide, silicon carbonitride, and silicon oxide, and a thickness of the silicide layer is 10 to 300 nm.

5. A method of preparing a high-quality emitter using the laminated dopant source structure of claim 1, comprising the following steps:
- at step S1, preparing the nano silicon oxide layer on the front surface of the crystalline silicon substrate;
- at step S2, performing a plasma treatment on the nano silicon oxide layer;
- at step S3, depositing the doped silicon oxide layer on a surface of the nano silicon oxide layer;
- at step S4, depositing the dopant source layer on a surface of the doped silicon oxide layer;
- at step S5, performing laser processing on an electrode area to enable boron or phosphorus to diffuse to the crystalline silicon substrate;
- at step S6, performing high-temperature annealing to enable a laser-processed area to be subjected to boron or phosphorus secondary diffusion and a non-laser area to be subjected to boron or phosphorus diffusion; and
- at step S7, removing a remaining laminated dopant source structure so that the front surface of the crystalline silicon substrate is formed into a selective emitter structure.

6. The method of preparing the high-quality emitter of claim 5, wherein before the step S5, the method further comprises depositing a silicide layer on a surface of the dopant source layer.

7. The method of preparing the high-quality emitter of claim 6, wherein by a chemical vapor deposition technology, the doped silicon oxide layer, the dopant source layer, and the silicide layer are prepared.

8. The method of preparing the high-quality emitter of claim 5, wherein in the step S1, a preparation method of the nano silicon oxide layer is selected from one of a wet chemical method, a high-temperature oxidation method, an ozone oxidation method, and a plasma assisted oxidation method.

9. The method of preparing the high-quality emitter of claim 5, wherein in the step S2, a plasma is selected from one or more of $H_2$, Ar, $N_2O$, $C_2O$, and $NH_3$.

10. The method of preparing the high-quality emitter of claim 5, wherein the step S7 specifically comprises: etching away the dopant source layer by an inorganic alkaline solution, and etching away the doped silicon oxide layer and the nano silicon oxide layer by using hydrofluoric acid, and then etching a surface of the crystalline silicon substrate by an organic alkaline solution or alternately etching the surface of the crystalline silicon substrate by the hydrofluoric acid and nitric acid.

11. A high-quality emitter, wherein the high-quality emitter is prepared by the method of claim 5.

12. The high-quality emitter of claim 11, wherein the high-quality emitter contains carbon and/or nitrogen element.

13. The laminated dopant source structure of claim 2, further comprising a silicide layer laid on the dopant source layer; a material of the silicide layer is selected from one of silicon nitride, silicon carbide, silicon carbonitride, and silicon oxide, and a thickness of the silicide layer is 10 to 300 nm.

14. The laminated dopant source structure of claim 3, further comprising a silicide layer laid on the dopant source layer; a material of the silicide layer is selected from one of silicon nitride, silicon carbide, silicon carbonitride, and silicon oxide, and a thickness of the silicide layer is 10 to 300 nm.

15. The method of preparing the high-quality emitter of claim 5, wherein in the laminated dopant source structure, a thickness of the nano silicon oxide layer is 1 to 3 nm, a thickness of the doped silicon oxide layer is 1 to 100 nm, and a thickness of the dopant source layer is 10 to 500 nm.

16. The method of preparing the high-quality emitter of claim 5, wherein in the laminated dopant source structure, a boron doping concentration in the dopant source layer is 5E17 to 5E19 $cm^{-3}$, and a phosphorus doping concentration is 5E17 to 1E20 $cm^{-3}$.

17. The method of preparing the high-quality emitter of claim 5, wherein the laminated dopant source structure further comprises a silicide layer laid on the dopant source layer; a material of the silicide layer is selected from one of silicon nitride, silicon carbide, silicon carbonitride, and silicon oxide, and a thickness of the silicide layer is 10 to 300 nm.

18. The high-quality emitter of claim 11, wherein before the step S5, the method further comprises depositing a silicide layer on a surface of the dopant source layer.

19. The high-quality emitter of claim 18, wherein in the method, by a chemical vapor deposition technology, the doped silicon oxide layer, the dopant source layer, and the silicide layer are prepared.

20. The high-quality emitter of claim 11, wherein in the step S1 of the method, a preparation method of the nano silicon oxide layer is selected from one of a wet chemical method, a high-temperature oxidation method, an ozone oxidation method, and a plasma assisted oxidation method.

* * * * *